(12) United States Patent
Shin (10) Patent No.: US 7,884,400 B2
(45) Date of Patent: Feb. 8, 2011

(54) IMAGE DEVICE AND METHOD OF FABRICATING THE SAME

(75) Inventor: Seung-hun Shin, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 489 days.

(21) Appl. No.: 12/014,294

(22) Filed: Jan. 15, 2008

(65) Prior Publication Data

US 2008/0203516 A1    Aug. 28, 2008

(30) Foreign Application Priority Data

Feb. 26, 2007  (KR) .................. 10-2007-0019133

(51) Int. Cl.
*H01L 31/00*    (2006.01)
(52) U.S. Cl. .................. 257/291; 257/292; 257/447; 257/460; 257/E27.133
(58) Field of Classification Search .................. 257/228, 257/229, 233, 291, 292, 447, 460, E27.133, 257/E27.132
See application file for complete search history.

(56) References Cited

U.S. PATENT DOCUMENTS

| 7,101,726 B2 | 9/2006 | Yamamoto et al. |
| 2005/0099532 A1* | 5/2005 | Tseng .......................... 348/374 |

FOREIGN PATENT DOCUMENTS

| JP | 2005-209677 | 8/2005 |
| KR | 1020060077135 A | 7/2006 |
| KR | 1020060077173 A | 7/2006 |

* cited by examiner

*Primary Examiner*—Minh-Loan T Tran
(74) *Attorney, Agent, or Firm*—Volentine & Whitt, P.L.L.C.

(57) ABSTRACT

An image device and a method of fabricating the image device include a substrate pattern formed to define an opening and to include a portion of a photodiode for receiving light. Stacked metal interconnection patterns and an interlayer dielectric layer are formed beneath the substrate pattern. A height of the opening equals a height of the substrate pattern, such that an exposed portion of a top surface of the interlayer dielectric layer provides a bottom surface of the opening. An external connection electrode is positioned on the bottom surface of the opening.

15 Claims, 7 Drawing Sheets

IMAGE DEVICE AND METHOD OF FABRICATING THE SAME

CROSS-REFERENCE TO RELATED PATENT APPLICATION

A claim of priority is made to Korean Patent Application No. 10-2007-0019133, filed on Feb. 26, 2007, the subject matter of which is hereby incorporated by reference.

BACKGROUND OF THE INVENTION

1. Field of the Invention

The present invention relates to an image device and a method of fabricating the same, and more particularly, to an image device having an opening in which an external connection electrode is formed and a method of fabricating the image device.

2. Description of the Related Art

Image devices refer to devices that convert optical signals to electric signals. For example, a charge coupled device (CCD) and a complementary metal-oxide semiconductor (CMOS) image sensor (CIS) are considered image devices. The CCD includes multiple MOS capacitors, which are operated by moving electric charges (carriers) produced by light. The CIS is driven by a CMOS circuit that controls multiple unit pixels and corresponding output signals. The CCD has a complicated driving method, large power consumption and a complicated fabricating process. Also, because a signal processing circuit cannot be integrated with a chip of the CCD, it is difficult to make a CCD in a single chip. In contrast, because CMOS image devices can be fabricated through previously used CMOS technology, research and development have focused on CMOS image devices that can be more easily fabricated. Examples of CMOS image devices will be described below.

Figure 1:
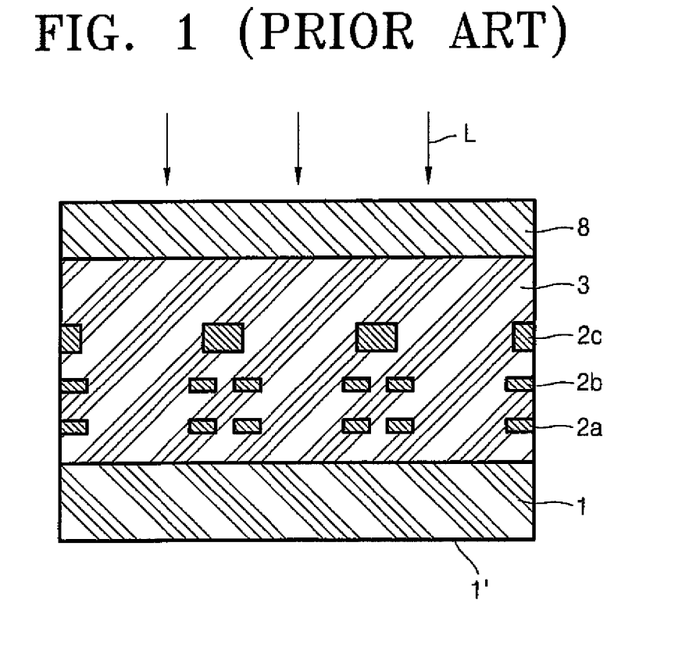
FIGS. 1 through 3 are cross-sectional views of conventional image devices.
Figure 2:
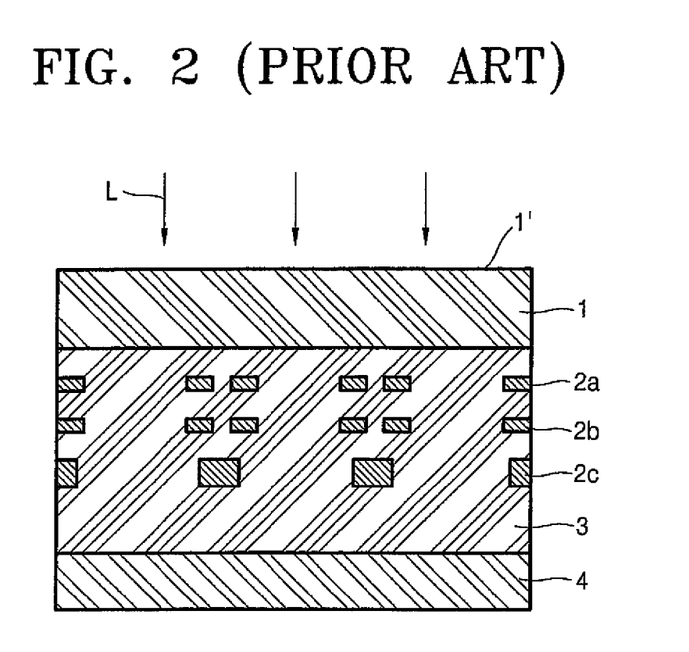
Figure 3:
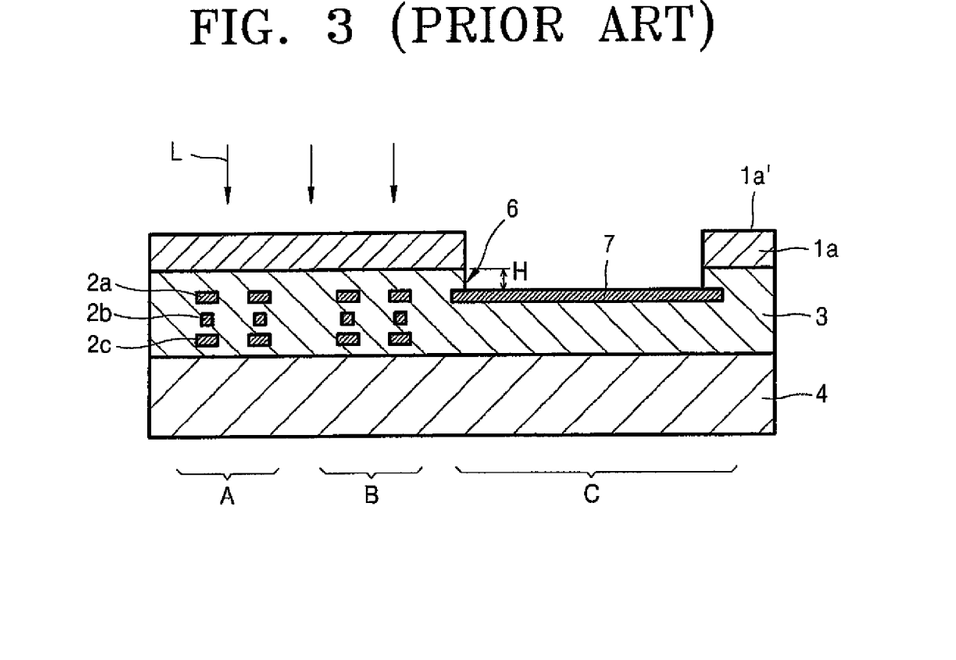

FIGS. 1 through 3 are cross-sectional views of conventional image devices. Referring to FIG. 1, an image device includes a semiconductor substrate 1, metal interconnection patterns 2a, 2b and 2c stacked on the substrate 1 and an interlayer dielectric layer 3. A planarization layer and a color filter portion 8 are formed on the interlayer dielectric layer 3, which is schematically illustrated. The substrate 1 includes a photodiode (not shown) for receiving light L, e.g., from a photographing operation. When light L is incident on the photodiode, the interlayer dielectric layer 3 and the metal interconnection patterns 2a, 2b and 2c may interrupt the incidence of the light L. Thus, sensitivity is degraded due to the metal interconnection patterns, particularly as the size of a pixel in a CMOS image device is scaled down.

FIG. 2 is a cross-sectional view of an image device having a backside illumination structure. Referring to FIG. 2, the image device includes stacked metal interconnection patterns 2a, 2b and 2c, an interlayer dielectric layer 3, and a substrate 1 formed thereon. A support substrate 4 may be formed beneath a bottom surface of the interlayer dielectric layer 3 as necessary. The substrate 1 includes a photodiode (not shown) for receiving light L, e.g., from a photographing operation. When light L is incident on the photodiode, the interlayer dielectric layer 3 and the metal interconnection patterns 2a, 2b and 2c do not interrupt the incidence of the light L. In other words, the image device of FIG. 2 addresses the problem of the image device of FIG. 1 since the light L is incident on a backside 1' of the substrate 1.

FIG. 3 is a cross-sectional view showing an external connection region of a backside-illumination-type image device having a backside 1a'. The conventional backside-illumination-type image device is divided into an active pixel region A, in which data received from a photodiode are processed; a logic circuit region B, positioned adjacent to the active pixel region A, in which signals received from the active pixel region A are converted to logic signals; and an external connection region C, positioned adjacent to the logic circuit region B, which outputs logic signals received from the logic circuit region B. An interlayer dielectric layer 3 and stacked metal interconnection patterns 2a, 2b and 2c are formed in each of the active pixel region A and logic circuit region B. The metal interconnection patterns may be formed as multiple layers, e.g., three layers including first, second and third metal interconnection patterns 2a, 2b and 2c.

In the external connection region C, an external connection electrode 7 is formed within an opening 6. Because the external connection electrode 7 is simultaneously formed with the first metal interconnection pattern 2a, the opening 6 is formed by passing through a substrate 1a and extending into a portion of the interlayer dielectric layer 3. As a result, a step difference H occurs between the interlayer dielectric layers of the active pixel region A and the logic circuit region B, and the interlayer dielectric layer of the external connection region C. Therefore, when a material of the substrate 1a is different from that of the interlayer dielectric layer 3 (e.g., silicon and oxide), the opening 6 is formed by double etching. Also, when the external connection electrode 7 is simultaneously formed with the first metal interconnection pattern 2a, the thickness of the external connection electrode 7 is the same as that of the interconnection pattern 2a, and thus cannot be independently determined.

SUMMARY OF THE INVENTION

According to an aspect of the present invention, there is provided an image device include a substrate pattern and stacked metal interconnection patterns and an interlayer dielectric layer formed beneath the substrate pattern. The substrate pattern defines an opening and includes a portion of a photodiode for receiving light. A height of the opening equals a height of the substrate pattern, such that an exposed portion of a top surface of the interlayer dielectric layer provides a bottom surface of the opening, and an external connection electrode is positioned on the bottom surface of the opening.

The image device may further include first contacts positioned beneath the substrate pattern, and the metal interconnection patterns may include a first metal interconnection pattern, positioned closest to the substrate pattern. The first contacts electrically connect the substrate pattern and the first metal interconnection pattern. The external connection electrode may directly contact at least one of the first contacts. The external connection electrode may be a metal electrode, and the substrate pattern may be a silicon substrate.

The image device may further include a passivation pattern on a side surface of the opening. The passivation pattern may include an oxide layer or a nitride layer. Also, the image device may include a support substrate positioned beneath a bottom surface of the interlayer dielectric layer.

According to another aspect of the present invention, there is provided an image device including an active pixel region for processing data received from a photodiode; a logic circuit region, positioned adjacent to the active pixel region, for converting a pixel signal received from the active pixel region to a logic signal; and an external connection region, positioned adjacent to the logic circuit region, for outputting the logic signal received from the logic circuit region. Each of the active pixel region, the logic circuit region and the external connection region respectively includes stacked metal interconnection patterns, an interlayer dielectric layer and a substrate pattern positioned on the interlayer dielectric layer. The substrate pattern in the external connection region defines an opening exposing a top surface of the corresponding interlayer dielectric layer. An external connection electrode is positioned on the exposed top surface of the interlayer dielectric layer. The exposed top surface of the interlayer dielectric layer in the external connection region is in the same plane as a top surface the interlayer dielectric layer in the active pixel region and a top surface of the interlayer dielectric layer in the logic circuit region.

Each of the stacked metal interconnection patterns may include a first metal interconnection pattern closest to the corresponding substrate pattern. A first contact may be formed in each of the active pixel region, the logic circuit region and the external connection region beneath the corresponding substrate pattern to electrically connect the substrate pattern and the corresponding stacked first metal interconnection patterns. The external connection electrode may directly contact the first contact in the external connection region. A support substrate may be included beneath a bottom surface of each of the interlayer dielectric layers.

According to another aspect of the present invention, there is provided a method of fabricating an image device. The method includes forming stacked metal interconnection patterns, an interlayer dielectric layer and a semiconductor substrate; forming a first layer pattern for exposing a predetermined first region on the substrate; etching the substrate using the first layer pattern as an etching mask to form a substrate pattern defining an opening corresponding to the first region; and forming an external connection electrode on a bottom surface of the opening.

Etching the substrate may include exposing a portion of a top surface of the interlayer dielectric layer. The exposed portion of the top surface of the interlayer dielectric corresponds to the bottom surface of the opening.

The method may further include forming a first contact in the interlayer dielectric. Also, forming the stacked metal interconnection patterns may include forming a first metal interconnection pattern closest to the substrate pattern, where the first contact electrically connects the first metal interconnection pattern and the substrate pattern. Etching the substrate may initially expose the first contact. The first layer pattern may include a photoresist pattern, and the substrate may be a silicon substrate.

The method may further include forming a passivation pattern on a side surface of the opening after etching the substrate to form the substrate pattern. The passivation pattern may be an oxide pattern or a nitride pattern.

BRIEF DESCRIPTION OF THE DRAWINGS

The embodiments of the present invention will be described with reference to the attached drawings, in which.

DETAILED DESCRIPTION OF THE EMBODIMENTS

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. In the drawings, the thicknesses of layers and regions are exaggerated for clarity. Also, throughout the drawings and written description, like reference numerals will be used to refer to like or similar elements.

It is understood that when an element, such as a layer, region or substrate is referred to as being on another element, it can be directly on the other element or intervening elements may also be present. In contrast, if an element such as a layer, region or substrate is referred to as being directly on another element, then no other intervening elements are present. As used herein, the term and/or includes any and all combinations of one or more of the associated listed items. Furthermore, relative terms, such as beneath, upper, and/or lower may be used to describe one element's relationship to another element as illustrated in the figures. It is understood, however, that relative terms are intended to encompass various different orientations of the device, in addition to the orientation depicted in the figures. For example, if the device depicted in a figure is turned over, elements described as below other elements would then be oriented above the other elements. Thus, the term "below," for example, is intended to encompass other relative orientations, including "above."

Various embodiments of the present invention provide a backside-illumination-type image device having an external connection electrode for simplifying a fabricating process, as well as a method of fabricating the image device.

Figure 4:
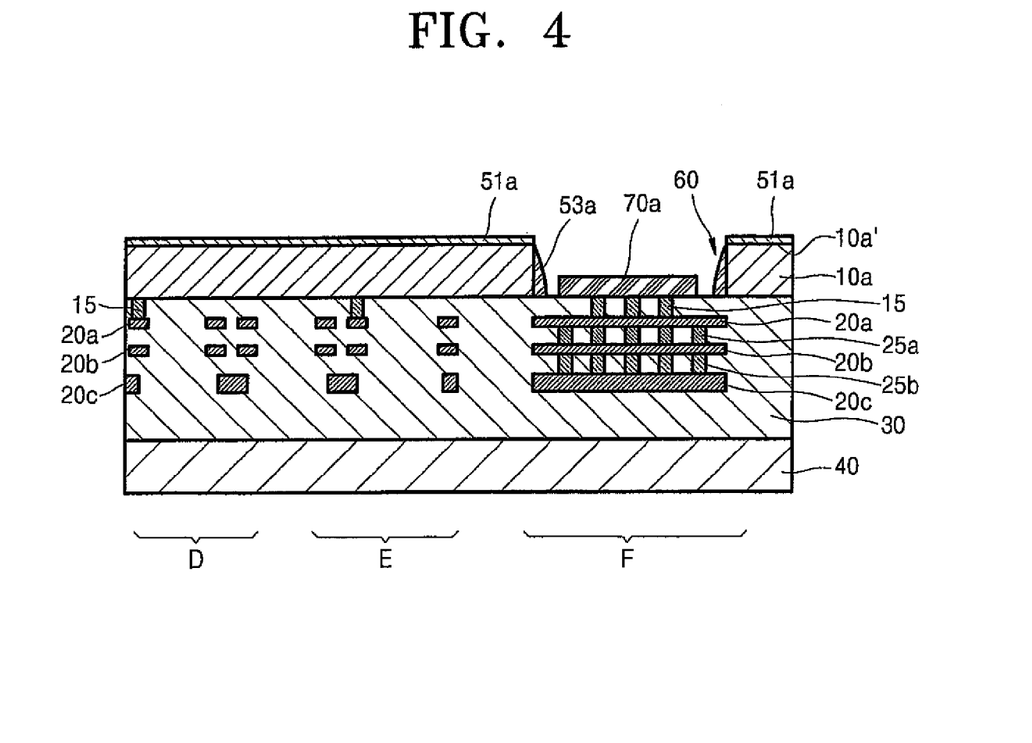
FIGS. 4 and 5 are cross-sectional views of an image device, according to an exemplary embodiment of the present invention.
Figure 5:
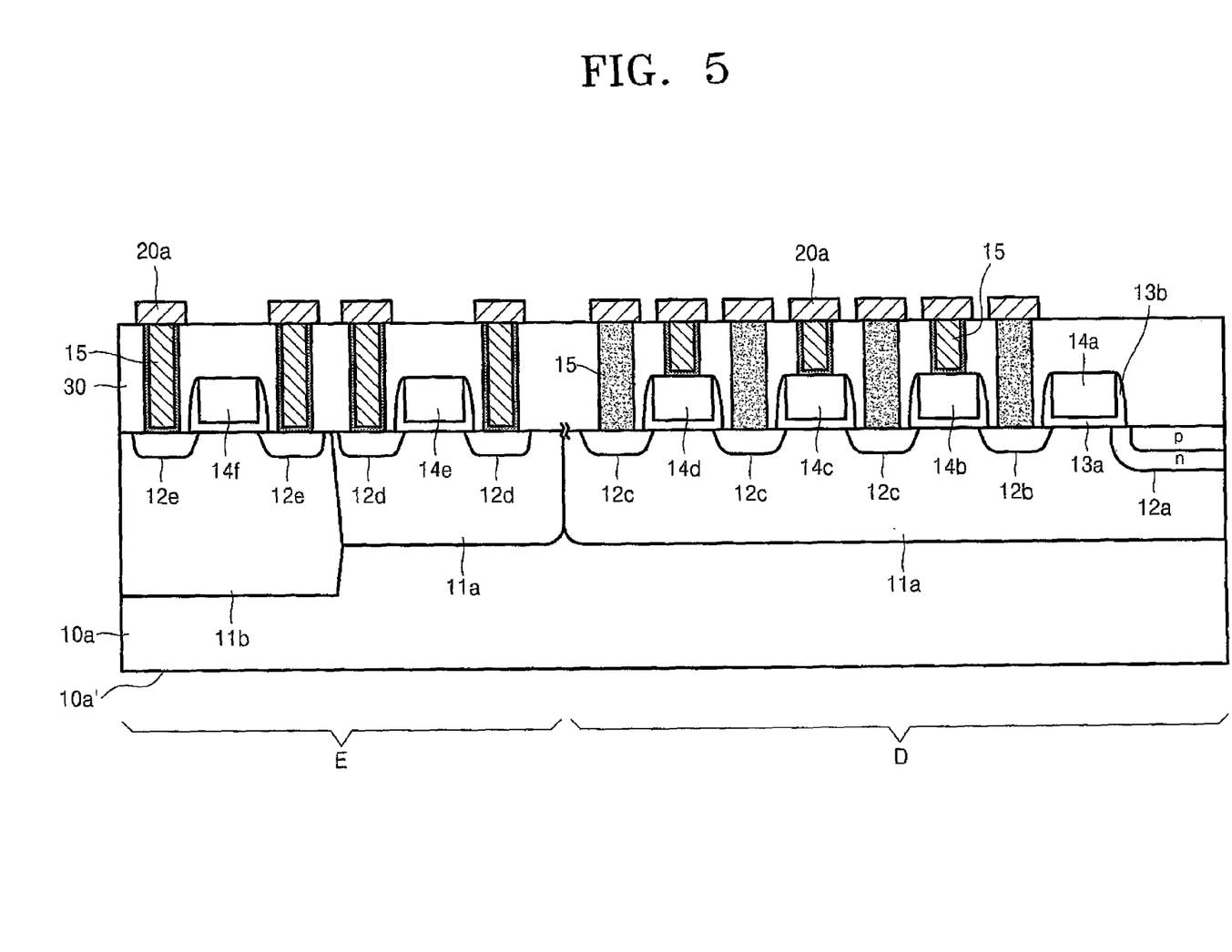

FIGS. 4 and 5 are cross-sectional views of an image device according to an illustrative embodiment of the present invention. Referring to FIG. 4, the image device includes a portion of a photodiode (not shown) for receiving light (e.g., from a photographing operation) and a substrate pattern 10a having an opening 60. The image device includes an interlayer dielectric layer 30 and metal interconnection patterns 20a, 20b and 20c stacked below the substrate pattern 10a. The image device is divided into an active pixel region D, in which data received from a photodiode are processed; a logic circuit region E, positioned adjacent to the active pixel region D, in which signals received from the active pixel region D are converted to corresponding logic signals; and an external connection region F, positioned adjacent to the logic circuit region E, which outputs signals provided by the logic circuit region E.

FIG. 5 is a cross-sectional view illustrating portions of the active pixel region D and logic circuit region E, shown in FIG. 4. It is understood that FIG. 5 depicts a structure in which the image device of FIG. 4, having a backside 10a' illumination structure, is turned over.

As shown in FIG. 5, the active pixel region D and the logic circuit region E are confined by forming an isolation layer (not shown) in the substrate 10a. Wells 11a and 11b are formed in the substrate 10a. For example, because nMOS transistors are mostly formed in the active pixel region D, well 11a is formed as a p-well. Because nMOS and PMOS transistors should be integrated in the logic circuit region E, both p-well 11a and n-well 11b are formed.

A gate electrode 14a of a transfer transistor, a gate electrode 14b of a reset transistor and gate electrodes 14c and 14d of transistors constituting a source follower are formed in the active pixel region D. Gate electrodes 14e and 14f of nMOS and PMOS transistors are formed in the logic circuit region E. A gate oxide layer 13a is interposed between the semiconductor substrate 10a and each of the gate electrodes 14a to 14f. Insulating spacers 13b are formed on both sidewalls of each of the gate electrodes 14a to 14f. The gate electrodes 14a to 14f may be formed through the same process.

A photodiode region 12a is formed in an active region at one side of the gate electrode 14a of the transfer transistor through the junction of p-type and n-type impurity regions. A floating diffusion region 12b doped with n-type impurities, for example, is formed in an active region at the other side of the gate electrode 14a of the transfer transistor. Junction regions 12c, doped with n-type impurities, for example, are formed in active regions adjacent to each of the gate electrodes 14b to 14d formed in the active pixel region D. In the logic circuit region E, junction regions 12d doped with n-type impurities, for example, are formed at both sides of the gate electrode 14e of the nMOS transistor formed on the p-well 11a. Also, in the logic circuit region E, junction regions 12e doped with p-type impurities, for example, are formed at both sides of the gate electrode 14f of the PMOS transistor formed on the n-well 11b. Here, the floating diffusion region 12b and the n-type junction regions 12c formed in the active pixel region D, as well as the n-type junction regions 12d formed in the logic circuit region E, may be formed through the same process. Alternatively, the n-type and p-type junction regions 12b, 12c, 12d and 12e may be formed through different processes, and the order of the processes may vary, without departing from the spirit and scope of the present invention.

An interlayer dielectric layer 30 is formed on the semiconductor substrate 10a having the gate electrodes 14a to 14f, the junction regions 12c to 12e, the floating diffusion region 12b and the photodiode region 12a. First contacts 15 electrically contact the gate electrodes 14b to 14d, the junction regions 12c to 12e and the floating diffusion region 12b, respectively, and are formed inside the interlayer dielectric layer 30. A first metal interconnection pattern 20a is formed on the interlayer dielectric layer 30 so as to be connected electrically to each of the first contacts 15.

Referring to FIG. 5, each of the first contacts 15 that comes into contact with the junction regions 12c in the active pixel region D may be formed from a poly-silicon layer doped with impurities, for example. Also, each of the first contacts 15 that comes into contact with the gate electrodes 14b to 14d may be formed, for example, from a barrier metal layer, made of a Ti/Ti nitride layer formed on an inner wall of a contact hole, and a tungsten metal layer filling in the contact hole. However, the first contacts 15 may be formed from other suitable materials, without departing from the spirit and scope of the present invention.

Referring again to FIG. 4, each of the active pixel region D and the logic circuit region E includes stacked metal interconnection patterns 20a, 20b and 20c; an interlayer dielectric layer 30; and a substrate pattern 10a formed on the dielectric layer 30. The external connection region F includes stacked metal interconnection patterns 20a, 20b and 20c; an interlayer dielectric layer 30; and a substrate pattern 10a formed on the interlayer dielectric layer 30 and having an opening 60. An external connection electrode 70a of the external connection region F is positioned within the opening 60 and formed on a top surface of the interlayer dielectric layer 30. A height of the opening 60 may be the same as that of the substrate pattern 10a, so that a bottom surface of the opening 60 is not lower than the top surface of the interlayer dielectric layer 30 in the external connection region F. Accordingly, the top surface of the interlayer dielectric layer 30 in the external connection region F would not form a step difference with the top surface of each of the interlayer dielectric layers 30 in the active pixel region D and the logic circuit region E, but would be in the same plane. Also, the top surface of the interlayer dielectric layer 30 may act as the bottom surface of the opening 60.

The metal interconnection patterns 20a, 20b and 20c include a first metal interconnection pattern 20a closest in proximity to the substrate pattern 10a. The image device may be formed beneath a bottom surface of the substrate pattern 10a. First contacts 15, which electrically connect the substrate pattern 10a and the first metal interconnection pattern 20a, may be formed in each of the active pixel region D, the logic circuit region E and the external connection region F. In the external connection region F, the external connection electrode 70a may directly contact the first contact 15. The external connection electrode 70a may include a metal electrode, which may be formed from tungsten (W), aluminium (Al), copper (Cu) or titanium (Ti), for example. A passivation layer pattern 53a may be formed on a side surface of the opening 60. The passivation layer pattern 53a may include an oxide layer or a nitride layer, for example. Also, the substrate pattern 10a may be a silicon substrate, for example. A support substrate 40 may be formed beneath a bottom surface of the interlayer dielectric layer 30.

FIGS. 6 through 12 are cross-sectional views illustrating a method of fabricating an image device, according to an exemplary embodiment of the present invention.

Figure 6:
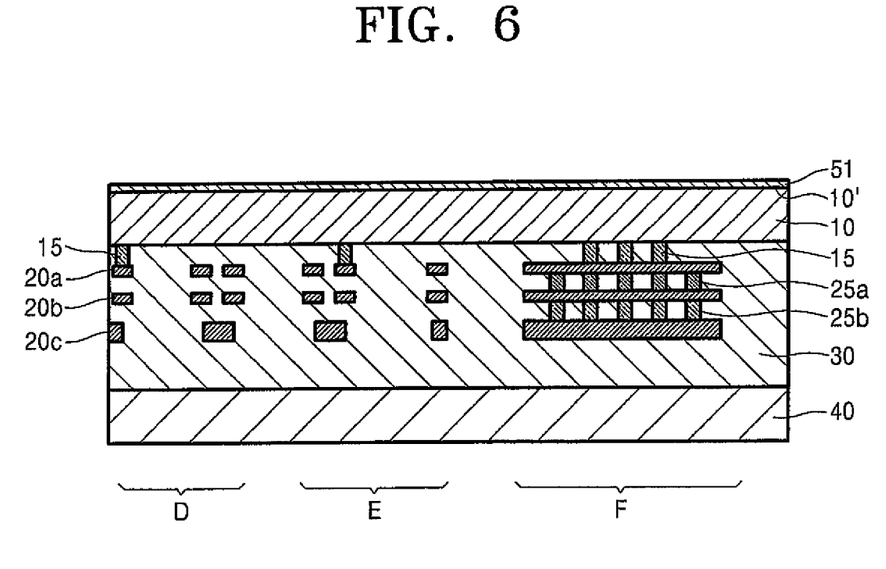
FIGS. 6 through 12 are cross-sectional views illustrating a method of fabricating an image device, according to an exemplary embodiment of the present invention.

Referring to FIG. 6, the method of fabricating an image device includes a process of forming stacked metal interconnection patterns 20a, 20b and 20c, an interlayer dielectric layer 30, and a substrate 10. As described with respect to FIG. 5, a photodiode, a gate and the like are first formed in a substrate 10, and a portion of an interlayer dielectric layer 30 is then formed on the substrate 10. Thereafter, first contacts 15 are formed, and first, second and third metal interconnection patterns 20a, 20b and 20c are sequentially formed. Since forming contacts and interconnection patterns is well known in the art, the processes will not be specifically described herein. A support substrate 40 may be formed beneath a bottom surface of the interlayer dielectric layer 30. Since the image device having a backside illumination structure has a structure in which light is incident on a backside 10', subsequent processes may be performed when the image device is turned upside down, such that the backside 10' of the substrate 10 faces upward. An etch stopping layer 51 may be formed on the substrate 10.

Figure 7:
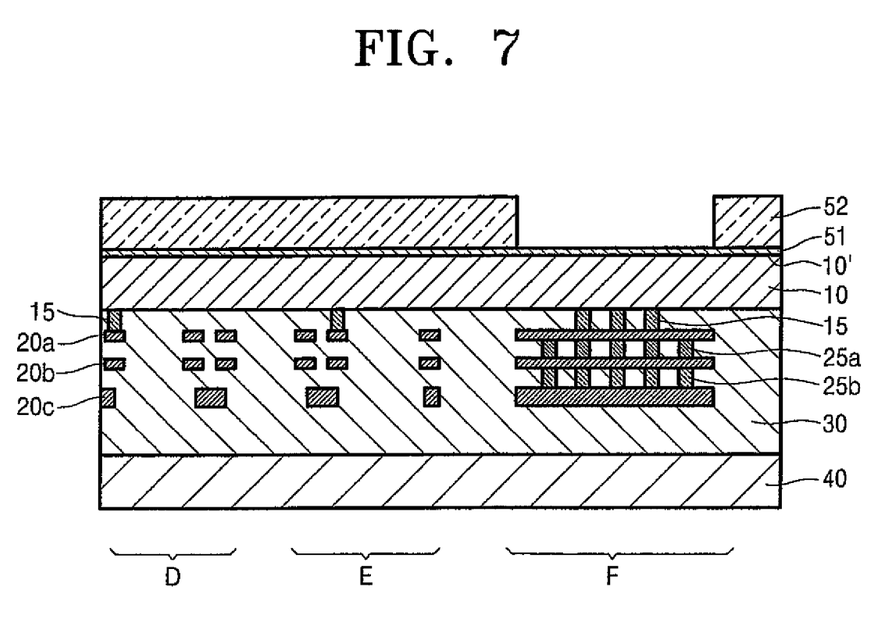

As shown in FIG. 7, a first layer pattern 52 is formed, defining an opening for exposing a predetermined first region in the external connection region F. The predetermined first region includes a region in which an external connection electrode is to be formed. The first layer pattern 52 may be a photoresist pattern, for example.

Figure 8:
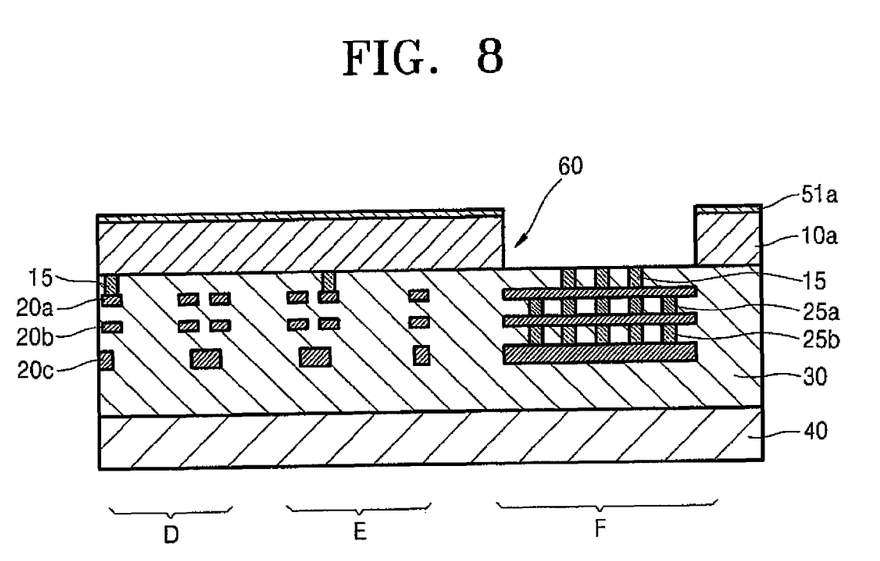

Referring to FIG. 8, the substrate 10 is etched using the first layer pattern 52 (FIG. 7) as an etching mask, thereby forming a substrate pattern 10a having an opening 60 corresponding to the first region. The etching process may include etching the substrate 10 until the interlayer dielectric layer 30 is exposed. In other words, the process of etching the substrate 10 may include etching the substrate 10 until the first contacts 15 are initially exposed. The interlayer dielectric layer 30 is not etched in the process of etching the substrate 10. Also, the substrate 10 may be a silicon substrate and the interlayer dielectric layer 30 may be an oxide or oxide-nitride layer, for example. Meanwhile, an etch stopping layer pattern 51a formed on the substrate pattern 10a of the active pixel region D and the logic circuit region E prevents the substrate 10 from being etched, except in the region of the opening 60.

Figure 9:
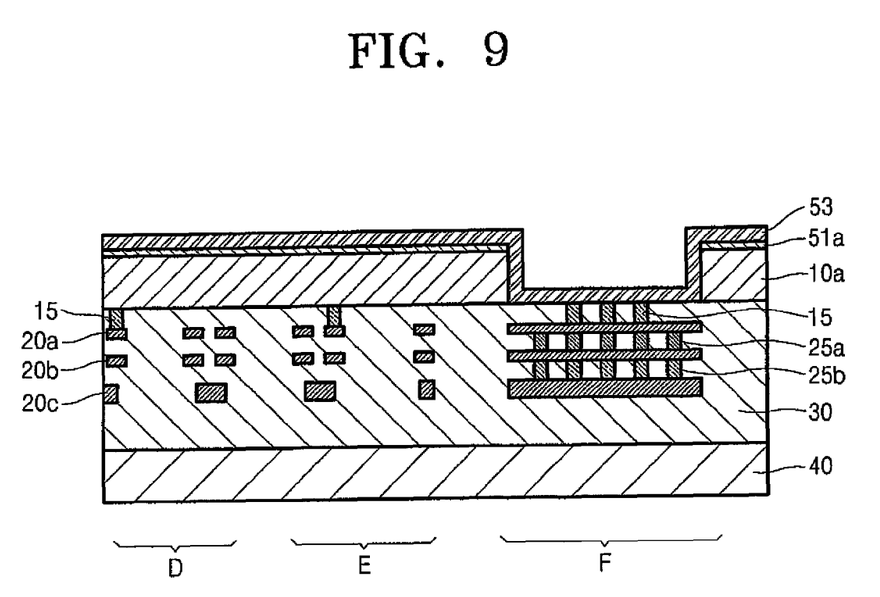

Referring to FIG. 9, a passivation layer 53 is formed on a top surface of the substrate pattern 10a having the opening 60. The passivation layer 53 may be an oxide or nitride layer, for example.

Figure 10:
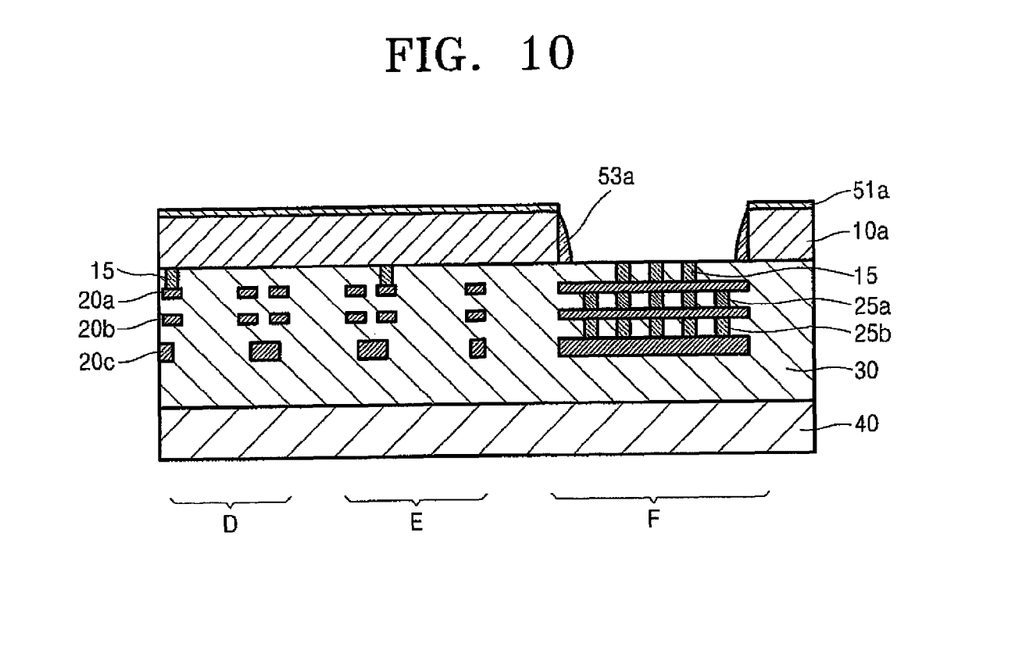

Referring to FIG. 10, a passivation layer pattern 53a may be formed on side surfaces of the opening 60 by performing an etching process on the surface of the passivation layer 53. The passivation layer pattern 53a may be a spacer pattern. Since an etching process for forming a spacer pattern is well known in the art, the process will not be specifically described herein.

Figure 11:
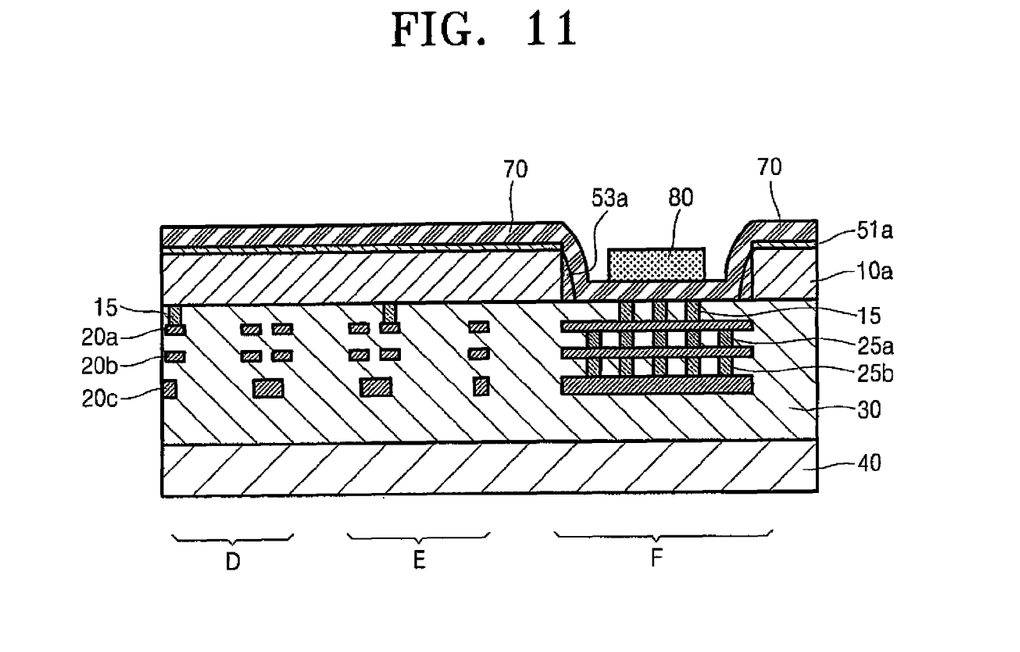

Referring to FIG. 11, a conductive second layer 70 is formed on a top surface of the substrate pattern 10a, which has the opening 60, and the passivation layer pattern 53a. The second layer 70 may be a metal layer formed from W, Al or Cu, for example. A hard mask layer pattern 80 is formed on a region in which an external connection electrode will be formed within the opening 60.

Figure 12:
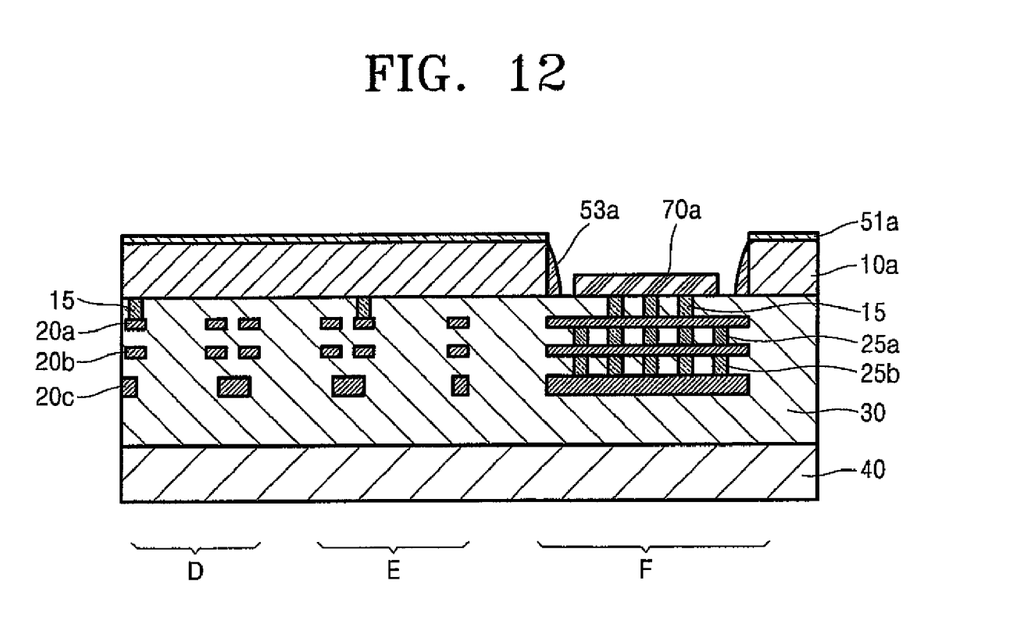

Referring to FIG. 12, the exposed second layer 70 is etched using the hard mask layer pattern 80 as an etching mask, thereby removing the exposed portions of the second layer 70. Upon removal of the hard mask layer pattern 80, an external connection electrode 70a is provided.

An image device having a backside illumination structure according to embodiments of the present invention may further include a planarization layer, a color filter, a lens, and the like.

In an image device and a method of fabricating the same according to embodiments of the present invention, the process of forming an external connection electrode is simplified.

While the present invention has been shown and described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A backside-illumination-type image device comprising:
a substrate pattern defining an opening and comprising a portion of a photodiode for receiving light through a top surface;
a plurality of stacked metal interconnection patterns and an interlayer dielectric layer formed beneath a bottom surface of the substrate pattern that is opposite the top surface of the substrate pattern; and
a plurality of first contacts formed in the interlayer dielectric layer to electrically connect the substrate pattern and a first metal interconnection pattern of the plurality of stacked metal interconnection patterns positioned closest to the substrate pattern,
wherein a height of the opening equals a height of the substrate pattern, such that an exposed portion of a top surface of the interlayer dielectric layer provides a bottom surface of the opening, and an external connection electrode is positioned on the bottom surface of the opening.

2. The image device of claim 1, wherein the external connection electrode directly contacts at least one of the plurality of first contacts.

3. The image device of claim 1, wherein the external connection electrode comprises a metal electrode.

4. The image device of claim 1, further comprising:
a passivation pattern on a side surface of the opening.

5. The image device of claim 4, wherein the passivation pattern comprises one of an oxide layer and a nitride layer.

6. The image device of claim 1, wherein the substrate pattern comprises a silicon substrate.

7. The image device of claim 1, further comprising:
a support substrate positioned beneath a bottom surface of the interlayer dielectric layer.

8. A backside-illumination-type image device comprising:
an active pixel region for processing data received from a photodiode;
a logic circuit region, positioned adjacent to the active pixel region, for converting a pixel signal received from the active pixel region to a logic signal; and
an external connection region, positioned adjacent to the logic circuit region, for outputting the logic signal received from the logic circuit region,
wherein each of the active pixel region, the logic circuit region and the external connection region comprises a plurality of stacked metal interconnection patterns, an interlayer dielectric layer, a first contact formed in the interlayer dielectric layer and connected to a first metal interconnection pattern of the plurality of stacked metal interconnection patterns positioned closest to the substrate pattern, and a substrate pattern positioned on the interlayer dielectric layer and configured to receive light through a light receiving surface that is opposite to a surface contacting the interlayer dielectric layer,
wherein the substrate pattern in the external connection region defines an opening exposing a top surface of the corresponding interlayer dielectric layer, an external connection electrode being positioned on the exposed top surface of the interlayer dielectric layer,
wherein the first contact formed in the interlayer dielectric layer in the external connection region is configured to electrically connect the corresponding first metal interconnection pattern and the external connection electrode, and the first contact formed in the interlayer dielectric layer in each of the active pixel region and the logic circuit region is configured to electrically connect the corresponding first metal interconnection pattern and the substrate pattern, and
wherein the exposed top surface of the interlayer dielectric layer in the external connection region is in the same plane as a top surface the interlayer dielectric layer in the active pixel region and a top surface of the interlayer dielectric layer in the logic circuit region.

9. The image device of claim 8, wherein the external connection electrode comprises a metal electrode.

10. The image device of claim 8, further comprising:
a passivation pattern on a side surface of the opening.

11. The image device of claim 10, wherein the passivation pattern comprises one of an oxide layer and a nitride layer.

12. The image device of claim 8, wherein the substrate pattern comprises a silicon substrate.

13. The image device of claim 8, further comprising:
a support substrate beneath a bottom surface of each of the interlayer dielectric layers.

14. A backside-illumination-type image device comprising:
- a substrate pattern having a planar top surface configured to receive light and a planar bottom surface, the substrate pattern comprising a portion of a photodiode and defining an opening;
- an interlayer dielectric layer formed beneath the substrate pattern, the interlayer dielectric layer having a planar top surface contacting the planar bottom surface of the substrate pattern, a portion the planar top surface of the interlayer dielectric layer being exposed by the opening defined by the substrate pattern, wherein an external connection electrode is positioned on the exposed portion of the planar top surface of the interlayer dielectric layer;
- a plurality of stacked metal interconnection patterns in the interlayer dielectric layer; and
- a plurality of first contacts in the interlayer dielectric layer, at least one first contact electrically connecting a first metal interconnection pattern of the plurality of stacked metal interconnection patterns in an external connection region to the external connection electrode.

15. The image device of claim 14, wherein at least another first contact electrically connects the first metal interconnection pattern of the plurality of stacked metal interconnection patterns in each of an active pixel region and a logic circuit region to the substrate pattern.

* * * * *